(12) United States Patent
Hosseini et al.

(10) Patent No.: US 8,836,120 B2
(45) Date of Patent: Sep. 16, 2014

(54) SEMICONDUCTOR DEVICE WITH A LAYER INCLUDING NIOBIUM, AND/OR TANTALUM OVERLYING A CONTACT PAD OR A METAL LAYER

(75) Inventors: Khalil Hosseini, Weihmichl (DE); Manfred Mengel, Bad Abbach (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 361 days.

(21) Appl. No.: 13/090,092

(22) Filed: Apr. 19, 2011

(65) Prior Publication Data

US 2012/0267784 A1    Oct. 25, 2012

(51) Int. Cl.
*H01L 23/48* (2006.01)
*H01L 23/00* (2006.01)

(52) U.S. Cl.
CPC ....... *H01L 24/05* (2013.01); *H01L 2924/01079* (2013.01); *H01L 2924/01041* (2013.01); *H01L 2924/15747* (2013.01); *H01L 2224/0401* (2013.01); *H01L 2224/48247* (2013.01); *H01L 2224/04026* (2013.01); *H01L 2224/45565* (2013.01); *H01L 2224/45681* (2013.01); *H01L 2224/05179* (2013.01); *H01L 24/29* (2013.01); *H01L 2224/43826* (2013.01); *H01L 2224/05147* (2013.01); *H01L 2224/05184* (2013.01); *H01L 2224/45572* (2013.01); *H01L 2224/05166* (2013.01); *H01L 2924/10329* (2013.01); *H01L 2924/01074* (2013.01); *H01L 2924/01019* (2013.01); *H01L 2924/10272* (2013.01); *H01L 2224/29179* (2013.01); *H01L 2224/45679* (2013.01); *H01L 2224/06181* (2013.01); *H01L 2924/01029* (2013.01); *H01L 2924/0132* (2013.01); *H01L 2224/32245* (2013.01); *H01L 2924/01006* (2013.01); *H01L 24/43* (2013.01); *H01L 2924/01327* (2013.01); *H01L 2224/8592* (2013.01); *H01L 24/33* (2013.01); *H01L 2224/45664* (2013.01); *H01L 24/32* (2013.01); *H01L 2924/014* (2013.01); *H01L 2224/05564* (2013.01); *H01L 2924/01082* (2013.01); *H01L 2224/73263* (2013.01); *H01L 2924/1461* (2013.01); *H01L 2924/01005* (2013.01); *H01L 2224/05681* (2013.01); *H01L 2224/73265* (2013.01); *H01L 2224/05558* (2013.01); *H01L 2224/29111* (2013.01); *H01L 24/37* (2013.01); *H01L 24/73* (2013.01); *H01L 24/45* (2013.01); *H01L 2924/10271* (2013.01); *H01L 2224/05679* (2013.01); *H01L 2224/04042* (2013.01); *H01L 2224/45147* (2013.01); *H01L 2224/05017* (2013.01); *H01L 2924/0105* (2013.01); *H01L 2224/33181* (2013.01); *H01L 2224/4569* (2013.01); *H01L 24/06* (2013.01); *H01L 2924/14* (2013.01); *H01L 2224/37147* (2013.01); *H01L 2924/01033* (2013.01); *H01L 2924/10253* (2013.01); *H01L 2224/45686* (2013.01); *H01L 2924/010473* (2013.01)
USPC .................................. 257/748; 257/E23.017

(58) Field of Classification Search
USPC ......................................................... 257/781
See application file for complete search history.

(56) References Cited

U.S. PATENT DOCUMENTS

| | | | |
|---|---|---|---|
| 4,950,359 A | 8/1990 | Parissis et al. | |
| 6,140,703 A | * 10/2000 | Cronin et al. | .................. 257/676 |
| 6,277,499 B1 | 8/2001 | Beers et al. | |

(Continued)

FOREIGN PATENT DOCUMENTS

EP        2190013 A2    5/2010

*Primary Examiner* — Eva Y Montalvo
(74) *Attorney, Agent, or Firm* — Slater & Matsil, L.L.P.

(57) ABSTRACT

A semiconductor device includes a semiconductor chip, a contact pad of the semiconductor chip and a first layer arranged over the contact pad. The first layer includes niobium, tantalum or an alloy including niobium and tantalum.

34 Claims, 5 Drawing Sheets

(56) References Cited

U.S. PATENT DOCUMENTS

| | | |
|---|---|---|
| 6,664,640 B2 | 12/2003 | Kohno |
| 6,790,757 B1 | 9/2004 | Chittipeddi et al. |
| 2004/0238955 A1 | 12/2004 | Homma et al. |
| 2007/0096281 A1* | 5/2007 | Greenberg et al. ............ 257/682 |
| 2007/0284415 A1 | 12/2007 | Hosseini |
| 2010/0006994 A1* | 1/2010 | Shim et al. ..................... 257/676 |
| 2010/0108359 A1 | 5/2010 | Dohle et al. |
| 2010/0244263 A1* | 9/2010 | Lin et al. ........................ 257/758 |

* cited by examiner

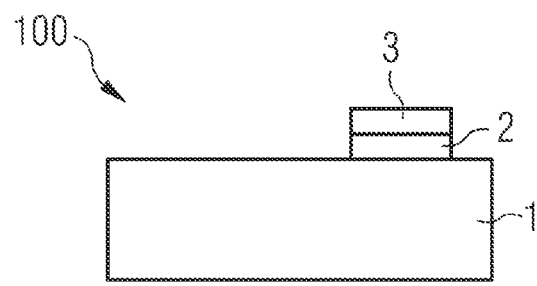
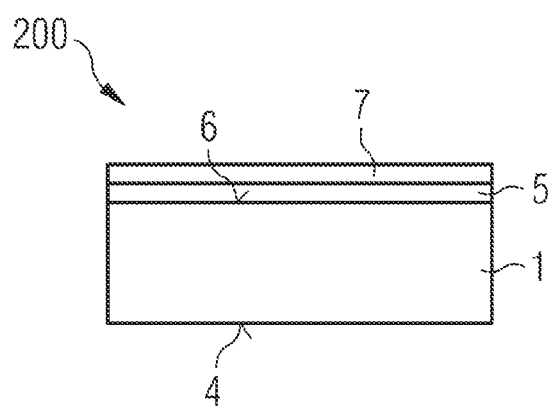
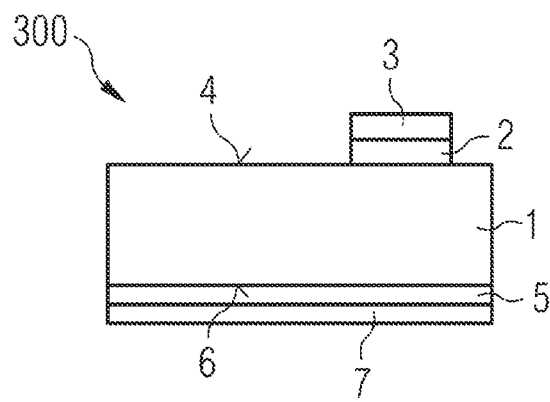

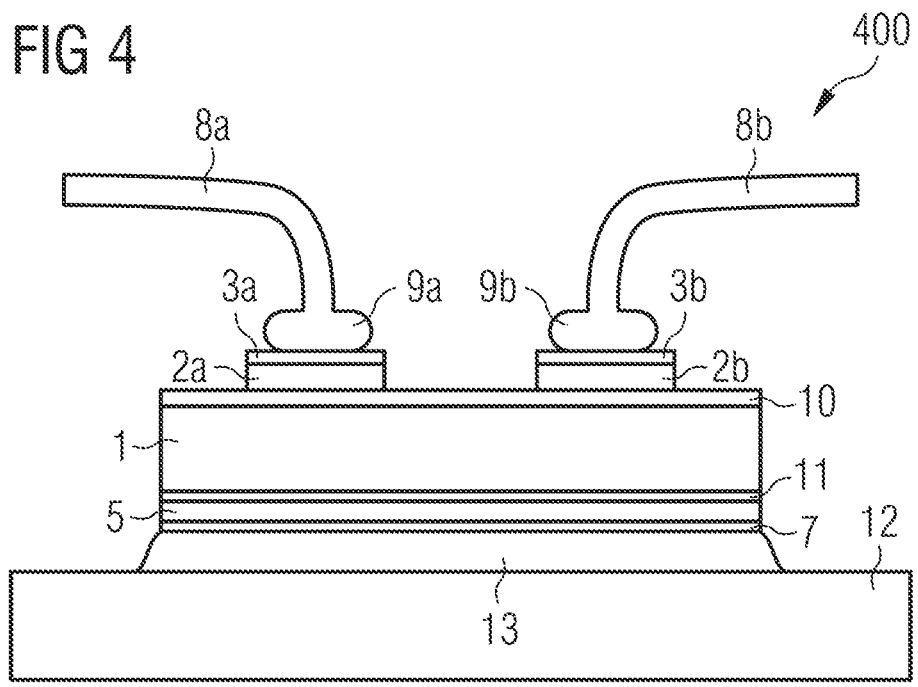
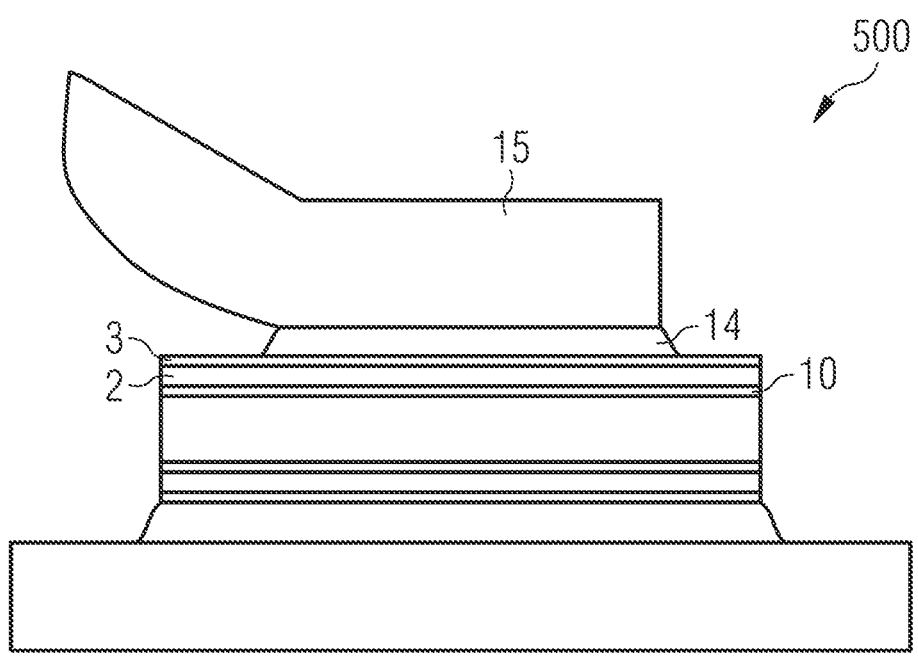

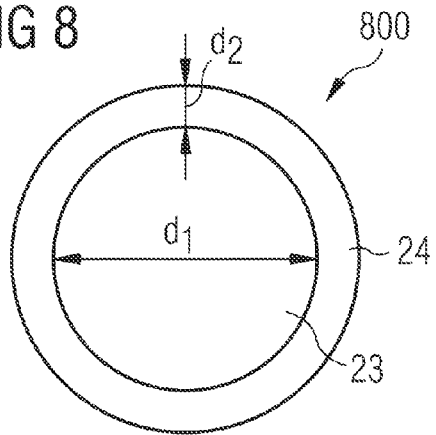
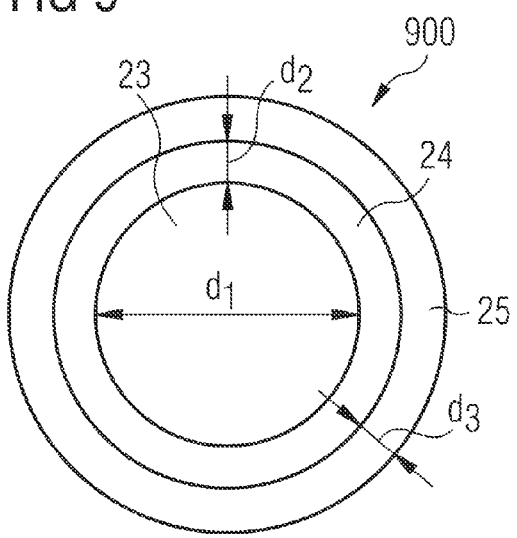
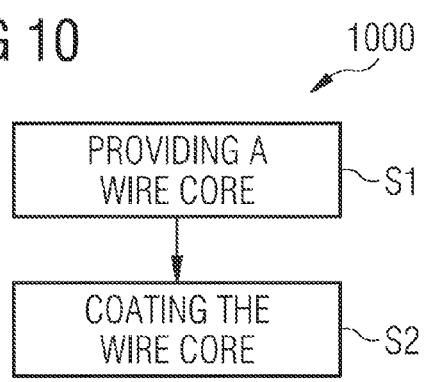

SEMICONDUCTOR DEVICE WITH A LAYER INCLUDING NIOBIUM, AND/OR TANTALUM OVERLYING A CONTACT PAD OR A METAL LAYER

TECHNICAL FIELD

The invention relates to a semiconductor device and a method for manufacturing a semiconductor device. In addition, the invention relates to a bonding wire and a method for manufacturing a bonding wire.

BACKGROUND

Bonding wires may suffer from oxidation occurring during a bonding process. Moreover, a corrosion of bonding wires or a migration between bonding wires may occur during an operation of a device including the bonding wires.

Semiconductor devices may include metal layers that may either suffer from oxidation or corrosion processes.

Bonding wires, semiconductor devices and methods for manufacturing these components constantly have to be improved regarding high performance, high reliability and low manufacturing costs. For these and further reasons there is a need for the present invention.

BRIEF DESCRIPTION OF THE DRAWINGS

The accompanying drawings are included to provide a further understanding of embodiments and constitute a part of this specification. The drawings illustrate embodiments and together with the description serve to explain principles of embodiments. Further embodiments and many of the intended advantages of embodiments will be readily appreciated as they become better understood by reference to the following detailed description.

FIG. 1 schematically illustrates a cross-section of a semiconductor device as an exemplary embodiment;

FIG. 2 schematically illustrates a cross-section of a semiconductor device as a further exemplary embodiment;

FIG. 3 schematically illustrates a cross-section of a semiconductor device as a further exemplary embodiment;

FIG. 4 schematically illustrates a cross-section of a semiconductor device as a further exemplary embodiment;

FIG. 5 schematically illustrates a cross-section of a semiconductor device as a further exemplary embodiment;

FIG. 8 schematically illustrates a cross-section of a bonding wire as an exemplary embodiment;

FIG. 9 schematically illustrates a cross-section of a bonding wire as a further exemplary embodiment;

FIG. 10 schematically illustrates a method for manufacturing a bonding wire as an exemplary embodiment;

DETAILED DESCRIPTION OF ILLUSTRATIVE EMBODIMENTS

Figure 6:
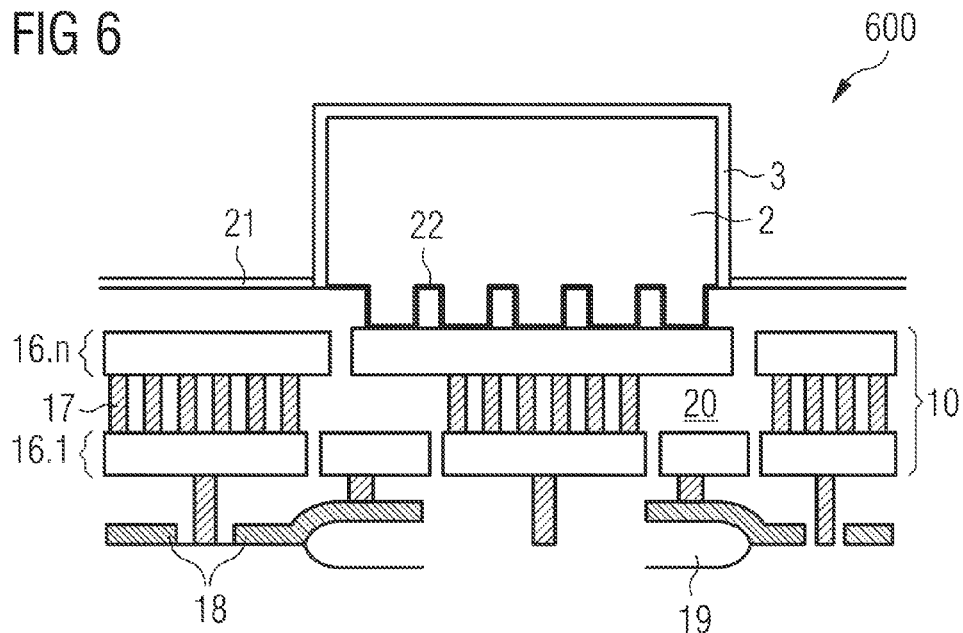
FIG. 6 schematically illustrates a cross-section of a part of a semiconductor device as a further exemplary embodiment.

Aspects and embodiments are described in the following with reference to the drawings, wherein like reference numerals are generally utilized to refer to like elements throughout.

In the following description, for purposes of explanation, numerous specific details are set forth in order to provide a thorough understanding of one or more aspects of the embodiments. However, it may be evident to a person skilled in the art that one or more aspects of the embodiments may be practiced with a lesser degree of the specific details. In further instances, known structures and elements are shown in schematic form in order to facilitate describing one or more aspects of the embodiments. The following description is therefore not to be taken in a limiting sense and the scope is defined by the appended claims. It is noted that the representations of the various elements in the figures are not necessarily to scale.

In the following description, reference is made to the accompanying drawings which form a part thereof and in which are shown by way of illustration specific embodiments in which the invention may be practiced. In this regard, directional terminology, such as, e.g., "upper", "lower", "top", "bottom", "left-hand", "right-hand", "front side", "backside", "vertical", "horizontal", etc., may be used with reference to the orientation of the figures being described. Since components of embodiments can be positioned in a number of different orientations, the directional terminology is used for purposes of illustration and is in no way limiting. It is understood that further embodiments may be utilized and structural or logical changes may be made without departing from the scope of the present invention. The features of the various exemplary embodiments described herein may be combined with each other unless specifically noted otherwise.

As employed in this specification, the terms "coupled", "electrically coupled", "connected" or "electrically connected" are not meant to mean that elements must be directly coupled or connected together. Intervening elements may be provided between the "coupled", "electrically coupled", "connected" or "electrically connected" elements.

The semiconductor devices described below may include a semiconductor material like Si, SiC, SiGe, GaAs or an organic semiconductor material. The semiconductor material may be embodied as a semiconductor wafer or a semiconductor chip of arbitrary type, for example, a power semiconductor chip. The semiconductor chip may include integrated circuits, control circuits to control integrated circuits, microprocessors and/or microelectromechanical components. The semiconductor chip may further include inorganic and/or organic materials that are not semiconductors, for example, insulators, plastics or metals.

The semiconductor devices and the bonding wires described below may include a layer including one of niobium (Nb), tantalum (Ta) and an alloy including niobium and tantalum. Note that the term "alloy" shall not solely refer to materials commonly designated as alloys, but shall also include materials that are commonly termed "intermetallics" or "intermetallic compounds". Note further that the percent by volume or the percent by weight of niobium or tantalum in the alloy is not restricted to a specific value, but may take any value between 0% and 100%, for example, one of the values 10%, 20%, 30%, 40%, 50%, 60%, 70%, 80%, 90%, 100%. It is understood that the layer may include further materials, in particular, further metals and/or metal alloys having physical and/or chemical properties similar to niobium, tantalum or alloys including niobium and tantalum. Of course, the layer may be contaminated by impurities that may occur during a fabrication of the layer. The percent by volume or the percent by weight of the one of niobium, tantalum and an alloy including niobium and tantalum included in the layer is not restricted to a specific value and is particularly greater than half of the overall volume or overall weight of the layer.

The layer may be used in various way, for example, it may be arranged over a contact pad and/or over a metal layer of a semiconductor chip and/or over a wire core of a bonding wire. The thickness of the layer may depend on its specific application and does not need to have a constant value, but may vary between arbitrary values. Generally, the layer's thickness may range between 0.5 nanometers and 500 nanometers. A layer arranged over a wire core may particularly have a reduced thickness between 20 nanometers and 70 nanometers.

The following table includes approximate values of physical and chemical properties for the materials tantalum and niobium. The layers including one of niobium, tantalum and an alloy including niobium and tantalum may have similar properties.

nected to the contact pad. Possibilities to contact the contact pad include soldering, wire bonding, clip bonding, flip chip mounting and probe needles. The connecting element may thus be embodied as a bonding wire or a bonding clip.

The bonding wires described below may include a wire core which may include a metal or a metal alloy, in particular, a copper or a copper alloy. The wire core may have a thickness between 10 micrometers and 600 micrometers, in particular, between 15 micrometers to 250 micrometers. The wire core may have a substantially circular cross section such that term "thickness" of the wire core may refer to the diameter of the wire core.

The bonding wires described below may include a coating material arranged over the wire core. The coating material includes one of niobium, tantalum and an alloy comprising niobium and tantalum. The properties of the coating material

| Property | Ta | Nb |
|---|---|---|
| Atomic number | 73 | 41 |
| Atomic mass | 180.95 [g/mol] | 92.91 [g/mol] |
| Melting point | 2996 [° C.] | 2468 [° C.] |
| Boiling point | 5458 [° C.] | 4927 [° C.] |
| Atomic volume | $1.80 \cdot 10^{-29}$ [m$^3$] | $1.80 \cdot 10^{-29}$ [m$^3$] |
| Vapor pressure at 1800° C. | $5 \cdot 10^{-4}$ [Pa] | $7 \cdot 10^{-6}$ [Pa] |
| Vapor pressure at 2500° C. | $5 \cdot 10^{-3}$ [Pa] | $2 \cdot 10^{-1}$ [Pa] |
| Density at 20° C. | 16.60 [g/cm$^3$] | 8.56 [g/cm$^3$] |
| Lattice structure | body-centered cubic | body-centered cubic |
| Lattice constant | $330.3 \cdot 10^{-12}$ [m] | $329.4 \cdot 10^{-12}$ [m] |
| Hardness at 20° C. (cold-worked) | 120-220 [HV10] | 110-180 [HV10] |
| Hardness at 20° C. (recrystallized) | 80-125 [HV10] | 60-110 [HV10] |
| Young's modulus at 20° C. | 186 [GPa] | 104 [GPa] |
| Poisson's ratio | 0.34 | 0.35 |
| Linear coefficient of thermal expansion at 20° C. | $6.4 \cdot 10^{-6}$ [m/(m · K)] | $7.1 \cdot 10^{-6}$ [m/(m · K)] |
| Thermal conductivity at 20° C. | 54 [W/(m · K)] | 52 [W/(m · K)] |
| Specific heat at 20° C. | 0.14 [J/(g · K)] | 0.27 [J/(g · K)] |
| Electrical conductivity at 20° C. | $8 \cdot 10^{-6}$ [1/(Ω · m)] | $7 \cdot 10^{-6}$ [1/(Ω · m)] |
| Specific electrical resistance at 20° C. | 0.13 [(Ω · mm$^2$)/m] | 0.14 [(Ω · mm$^2$)/m] |

The layer including one of niobium, tantalum and an alloy including niobium and tantalum may be deposited using various deposition methods. For example, the layer may be deposited using a sputtering process in which a gas phase of the material to be deposited is generated by ejecting particles from a solid target material into a vacuum. The layer may also be deposited using a vapor deposition process, in particular, chemical vapor deposition (CVD) or physical vapor deposition (PVD). In yet another embodiment, the layer may be deposited using a galvanic deposition or electroplating process in which a component is coated by the layer using an electric field to move metal ions in a solution.

Fabrication of the layer including one of niobium, tantalum and an alloy including niobium and tantalum is not restricted to a specific point in time. For example, a fabrication may be based on the wafer level packaging (WLP) technology such that a deposition of the layer is performed on wafer level. More specifically, in WLP, the layer may thus be deposited and processed on a surface of a wafer before the wafer is diced into single semiconductor chips. Alternatively, the layer may be deposited on a single semiconductor chip that has already been cut from a wafer.

The semiconductor devices described below may include a contact pad which may be made of or include a metal, in particular, copper. The contact pad may be configured to provide an electrical connection between an integrated circuit of the semiconductor device and a connecting element con- (physical and chemical properties, thickness, etc.) may correspond to the properties of similar layers already described in foregoing paragraphs.

The bonding wires described below may include a passivation layer, for example, an oxide layer. In this connection, the term "passivation" may refer to avoiding or inhibiting oxidation and corrosion of a material arranged underneath the passivation layer. For example, the passivation layer may be generated via a spontaneous formation of a hard non-reactive surface film (spontaneous passivation). The passivation layer may have a thickness between 1 nanometer and 10 nanometers, in particular, between 4 nanometers and 8 nanometers.

FIG. 1 schematically illustrates a cross-section of a semiconductor device 100 as an exemplary embodiment. The semiconductor device 100 includes a semiconductor chip 1 and a contact pad 2. A first layer 3 is arranged over the contact pad 2, wherein the first layer 3 includes one of niobium, tantalum and an alloy including niobium and tantalum.

The contact pad 2 may be made of a material which may suffer from oxidation processes. For example, the contact pad 2 may be made of or include copper such that an oxidation process may generate a layer of copper oxides CuO and/or CuO$_2$ on the surface of the contact pad 2. Due to a low ductility, such oxide layers may be brittle which may lead to a damage of the oxide layer and the contact pad 2 arranged underneath during or after a bonding process. An oxide layer on the contact pad 2 may thus make it difficult or even impossible to provide a connection between the contact pad 2 and a connecting element. Due to its physical and/or chemical properties, the first layer 3 may protect the contact pad 2 from the mentioned oxidation processes. Compared to an oxide layer, the first layer 3 may have a higher value of ductility such that the risk of a damage during a bonding process is reduced. Note further that tantalum and niobium have electrical conductivities of about $8 \cdot 10^{-6}$ [1/(Ω·m)] and $7 \cdot 10^{-6}$ [1/(Ω·m)], respectively. The first layer 3 may thus be suitable to support an electrical connection between the contact pad 2 and a connecting element coupled thereto.

The contact pad 2 may also be protected by layers differing from the first layer 3 in view of their material composition. For example, the contact pad 2 may be protected by a layer made of or including gold (Au). Note, however, that such layers are more expensive than the first layer 3. The contact pad 2 may also be protected by a layer made of or including one of nickel (Ni), nickel-palladium (NiPd), nickel-palladium-gold (NiPdAu) and titanium (Ti). In contrast to the first layer 3, such layers are more brittle which may result in a damage of the layer and a contact pad arranged underneath, for example, during a bonding process. In this connection, note that niobium and tantalum have an elastic limit of about 550 MPa, while nickel and titanium have elastic limits of about 480 MPa and 250 MPa, respectively. Note further that niobium has a Young's modulus of about 104 GPa at 20° C., while nickel and titanium have a Young's modulus of about 200 GPa and 120 GPa at 20° C., respectively.

FIG. 2 schematically illustrates a cross-section of a semiconductor device 200 as a further exemplary embodiment. The semiconductor device 200 includes a semiconductor chip 1 having an active surface 4 as well as a metal layer 5 arranged over an opposite surface 6 of the semiconductor chip 1 opposite the active surface 4. Here, the term "active surface" may relate to a surface of the semiconductor chip 1 providing an interaction between the semiconductor chip 1 and its environment. For example, an active surface may be a surface including contact pads providing an electrical connection between the semiconductor chip 1 and external components. The semiconductor device 200 further includes a second layer 7 arranged over the metal layer 5, wherein the second layer 7 includes one of niobium, tantalum and an alloy including niobium and tantalum. In FIG. 2, the metal layer 5 and the second layer 7 cover the whole area of the opposite surface 6. This case may particularly occur when the layers have been deposited on a wafer level, i.e., before the wafer is cut into single chips. Of course, there may be further embodiments in which the layers do not cover the whole opposite surface, but only parts of it.

The layers 5 and 7 may provide similar features as the components 2 and 3 of FIG. 1. For example, the layer 7 may protect the metal layer 5 which may be made of or include copper from oxidation processes. Above comments on components 2 and 3 of FIG. 1 thus may also hold true for the corresponding layers 5 and 7 of FIG. 2. The metal layer 5 may be used for a heat transport in a direction away from the semiconductor chip 1 during an operation of the same. Note that tantalum and niobium provide a good thermal conductivity of about 54 [W/(m·K)] and 52 [W/(m·K)], respectively. The layer 7 thus supports a heat transport in a direction away from the semiconductor chip 1 either.

FIG. 3 schematically illustrates a cross-section of a semiconductor device 300 as a further exemplary embodiment. The semiconductor device 300 includes a semiconductor chip 1 having a first surface 4 and a second surface 6 opposite the first surface 4. A contact pad 2 is arranged over the first surface 4, a first layer 3 is arranged over the contact pad 2, a metal layer 5 is arranged over the second surface 6 and a second layer 7 is arranged over the metal layer 5. Each of the first layer 3 and the second layer 7 includes one of niobium, tantalum and an alloy including niobium and tantalum. Note that the device 300 may be regarded as a combination of the devices 100 and 200 of FIGS. 1 and 2, wherein like reference signs refer to like components. Accordingly, statements made in connection with FIGS. 1 and 2 may also hold true for the device 300.

FIG. 4 schematically illustrates a cross-section of a semiconductor device 400 as a further exemplary embodiment. The device 400 includes a semiconductor chip 1 having an active surface with a first contact pad 2a and a second contact pad 2b. The first and second contact pad 2a, 2b are covered by first layers 3a, 3b, respectively, wherein each of the layers 3a, 3b includes one of niobium, tantalum and an alloy including niobium and tantalum. The contact pads 2a, 2b are electrically coupled to bonding wires 8a, 8b, respectively, and thus may provide an electrical connection between integrated circuits (not shown) of the semiconductor chip 1 and further components (not shown) connected to the opposite ends of the bonding wires 8a, 8b. In FIG. 4, the layers 3a, 3b are shown to be arranged between the contact pads 2a, 2b and the bonding wires 8a, 8b, thereby (spatially) separating the components. Of course, the bonding wires 8a, 8b may also be in partial or full (direct) contact with the contact pads 2a, 2b. This is because the layers 3a, 3b may be pushed aside during a bonding process such that the displaced material may at least partly be arranged on the side walls of the end sections 9a, 9b of the bonding wires 8a, 8b. The device 400 further includes a first metallization 10 arranged between the contact pads 2a, 2b and the semiconductor chip 1. A more detailed discussion of the first metallization 10 is given in connection with FIG. 6.

A metal layer 5, for example, made of or including copper, is arranged on the bottom side of the semiconductor chip 1. The metal layer 5 is covered by a second layer 7 including one of niobium, tantalum and an alloy including niobium and tantalum. The device 400 further includes a second metallization 11 which may be similar to the first metallization 10 and which is arranged between the semiconductor chip 1 and the metal layer 5. The device 400 is attached to a carrier 12 (e.g., a leadframe) by means of a layer 13 which may be made of or include a solder material (e.g., tin) and which is arranged between the second layer 7 and the carrier 12. Note that, during an operation of the device 400, heat may be transported through components 5, 7, 13 and 12 in a direction away from the semiconductor chip 1.

FIG. 5 schematically illustrates a cross-section of a semiconductor device 500 as a further exemplary embodiment. The device 500 is similar to the device 400, but a different technique for electrically connecting the device 500 to a connecting element is applied. The device 500 corresponds to the device 400 with regard to the first metallization 10 and all components arranged below the first metallization 10. In FIG. 5, the first metallization 10 is covered by a contact pad 2 and a first layer 3 including one of niobium, tantalum and an alloy including niobium and tantalum. A layer 14 made of or including a solder material (e.g. tin) is deposited on the layer 3 in order to provide an electrical connection between the semiconductor chip 1 and a bonding clip 15 which may be made of or include copper. In FIG. 5, the contact pad 2 and the layer 3 cover the whole upper surface of the semiconductor chip 1. It is however understood that the contact pad 2 and the layer 3 may also cover only a portion of the chip surface.

FIG. 6 schematically illustrates a cross-section of a part of a semiconductor device 600 as a further exemplary embodiment. Here, the first metallization 10 of FIG. 4 is discussed in more detail. The first metallization 10 includes multiple stacked metal layers 16.1 to 16.n, wherein, for the sake of simplicity, only two of the metal layers 16.1 to 16.n are illustrated. The spaces between the metal layers 16.1 to 16.n are filled with a dielectric material 20, for example, an oxide. The metal layers 16.1 to 16.n are connected to each other via through connections 17 substantially arranged perpendicular to the metal layers 16.1 to 16.n. The lowest metal layer 16.1 is connected to conductive components 18 of the semiconductor chip's integrated circuits. The conductive components 18 are isolated from further regions by means of a field oxide 19. As can be seen from FIG. 6, the first metallization 10 is configured to provide a chip-internal redistribution between components of integrated circuits and the contact pad 2. Note that the metal layers 16.1 to 16.n also extend in a direction perpendicular to the cross-section of FIG. 6.

The device 600 further includes a passivation layer 21 which may be made of or include silicon nitride and covers the top surface of the semiconductor chip. The passivation layer 21 is opened at the location of the contact pad 2 and a barrier layer 22 which may be made of or include one of titanium or tungsten (W) is arranged between the first metallization 10 and the contact pad 2 in order to provide an electrical connection between these components. Similar to FIG. 4, the contact pad 2 is covered by a layer 3 including one of niobium, tantalum and an alloy including niobium and tantalum. In FIG. 6, the top surface and the side walls of the contact pad 2 are covered by the layer 3.

Figure 7:
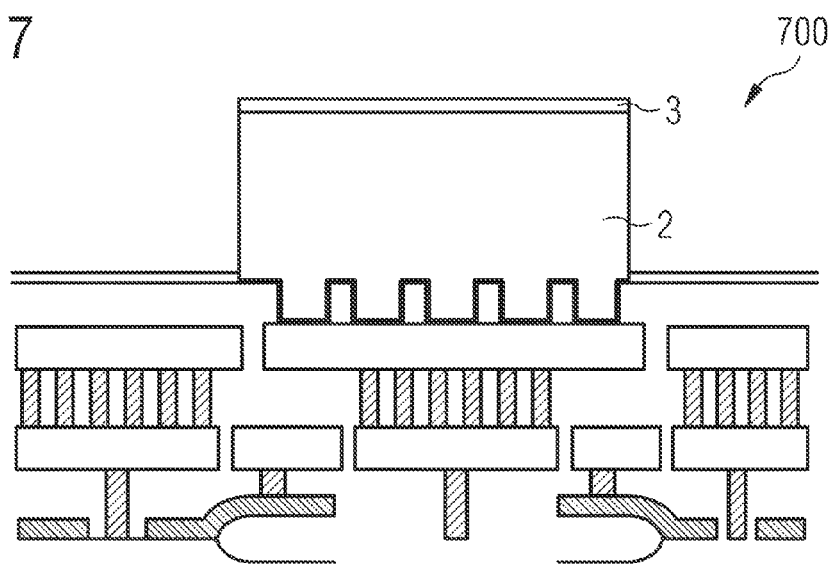
FIG. 7 schematically illustrates a cross-section of a part of a semiconductor device as a further exemplary embodiment.

FIG. 7 schematically illustrates a cross-section of a part of a semiconductor device 700 as a further exemplary embodiment. The device 700 is similar to the device 600. In contrast to FIG. 6, the layer 3 is substantially arranged on the top surface of the contact pad 2 while the side walls of the contact pad 2 remain uncovered.

FIG. 8 schematically illustrates a cross-section of a bonding wire 800 as an exemplary embodiment. The bonding wire 800 includes a wire core 23 and a coating material 24 coating the wire core 23. The coating material 24 includes one of niobium, tantalum and an alloy including niobium and tantalum. The diameter $d_1$ of the wire core 23 may have a value between 10 micrometers and 600 micrometers, in particular between 15 micrometers and 25 micrometers. Further, the thickness $d_2$ of the coating material 24 may particularly have a value of 20 nanometers to 40 nanometers.

The coating material 24 may provide features that have already been described in connection with the first layer 3 of FIG. 1. For example, the coating material 24 may protect the wire core 23 from oxidation processes which may occur during a bonding process, for example, performed above a temperature of 150° C. The wire core 23 may be made of or include copper which may result in a copper oxide layer on the wire core 23. Such oxide layers may be brittle which may result in a delamination from a contact pad. By applying the coating material 24 to the wire core 23, a forming of oxide layers may be avoided. In addition, the coating material 24 may avoid corrosion effects that may occur between the wire core 23 and further materials of a semiconductor device, for example, chemical additives included in a molding compound (i.e., a duroplastic, thermoplastic or thermosetting material).

The coating material 24 may further avoid a migration of the wire core's material between the bonding wire 800 and further bonding wires located at a small distance. A migration may particularly occur for the case of distances smaller than 60 micrometers between the bonding wires ("fine pitch"). By applying the coating material 24 to the wire core 23, short circuits between the adjacent bonding wires may thus be avoided. In addition, the coating material 24 may provide a higher ductility compared to the wire core 23 and/or an oxide layer formed on the wire core 23 such that bonding processes may be improved. Note further that using the coating material 24 may provide a well defined loop building of wire loops such that a wire sweeping may be avoided either.

There are further possibilities to avoid an oxidation of the wire core 23 during a bonding process. For example, the bonding may be performed in the atmosphere of a forming gas. Alternatively, a corrosion of the wire core 23 or a migration of the wire core's material between multiple bonding wires may be avoided by coating the wire core 23 with a layer made of or including palladium (Pd). Note, however, that a layer of palladium is more expensive compared to the coating material 24 including one of niobium, tantalum and an alloy comprising niobium and tantalum.

FIG. 9 schematically illustrates a cross-section of a bonding wire 900 as a further exemplary embodiment. The bonding wire 900 is similar to the bonding wire 800 of FIG. 8, but additionally includes a passivation layer 25 arranged over the coating material 24. The thickness $d_3$ of the passivation layer 25 may have a value between 1 nanometer and 10 nanometers, in particular between 4 nanometers and 8 nanometers.

FIG. 10 schematically illustrates a method 1000 for manufacturing a bonding wire as an exemplary embodiment. The method 1000 may be read in connection with FIG. 8. In a first method step S1, a wire core 23 is provided. In a second method step S2, the wire core 23 is coated with a coating material 24, the coating material 24 including one of niobium, tantalum and an alloy including niobium and tantalum. As it has already been mentioned in foregoing paragraphs, the process of coating the wire core 23 may include one of sputtering, vapor deposition and galvanic deposition.

In one embodiment, the steps S1 and S2 of method 1000 may be performed to produce isolated bonding wires, i.e., bonding wires that are not yet implemented in a device. The produced bonding wires already including the coating material 24 may then be implemented in a device afterwards. Alternatively, step S1 may be performed first and then the wire core 23 is implemented in a device. Afterwards, the already implemented (i.e., not isolated) wire core 23 is coated with the coating material 24. It is understood that the method 1000 may include further steps, for example, providing a passivation layer 25 over the coating material 24 (see FIG. 9).

Figure 11:
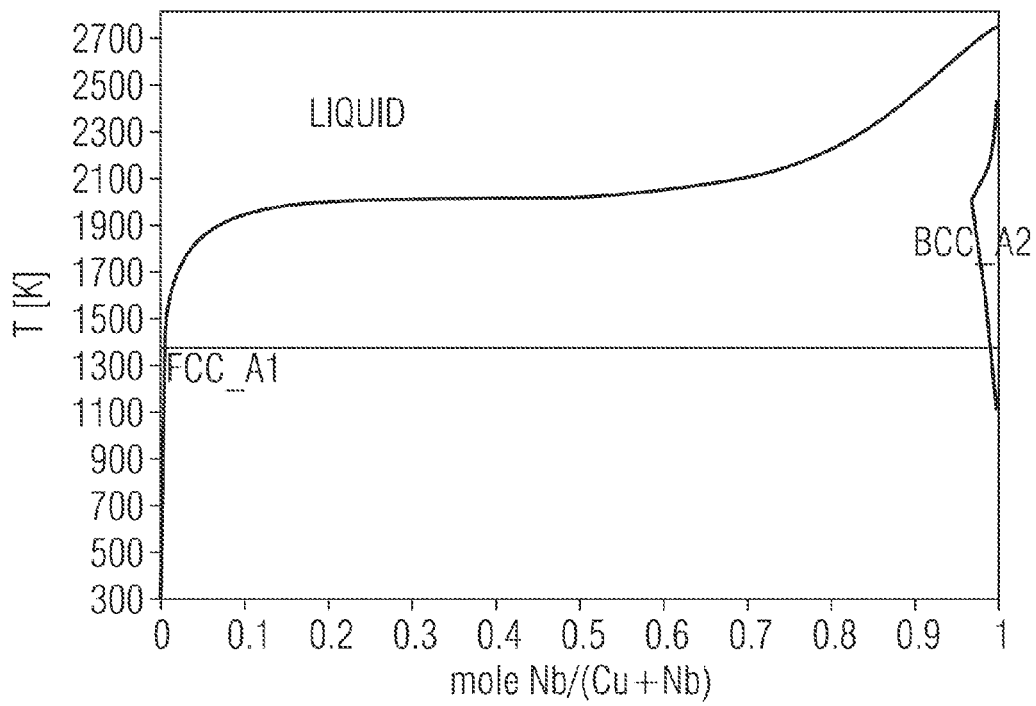
FIG. 11 schematically illustrates an alloy phase diagram of Cu—Nb.

FIG. 11 schematically illustrates an alloy phase diagram of Cu—Nb, wherein the temperature T(K) in Kelvin is plotted against the mole ratio Nb/(Cu+Nb). In the diagram, the liquid phase as well as the phases FCC (Face Centered Cubic)_A1 and BCC (Body Centered Cubic)_A2 are shown. From FIG. 11 it becomes apparent that layers made of or including copper and described in the foregoing paragraphs may also be replaced by layers made of niobium or a Cu—Nb-alloy. For example, the layer 5 of FIG. 2 may be replaced by a niobium layer or a Cu—Nb-alloy layer having similar properties according to the phase diagram of FIG. 11.

Figure 12:
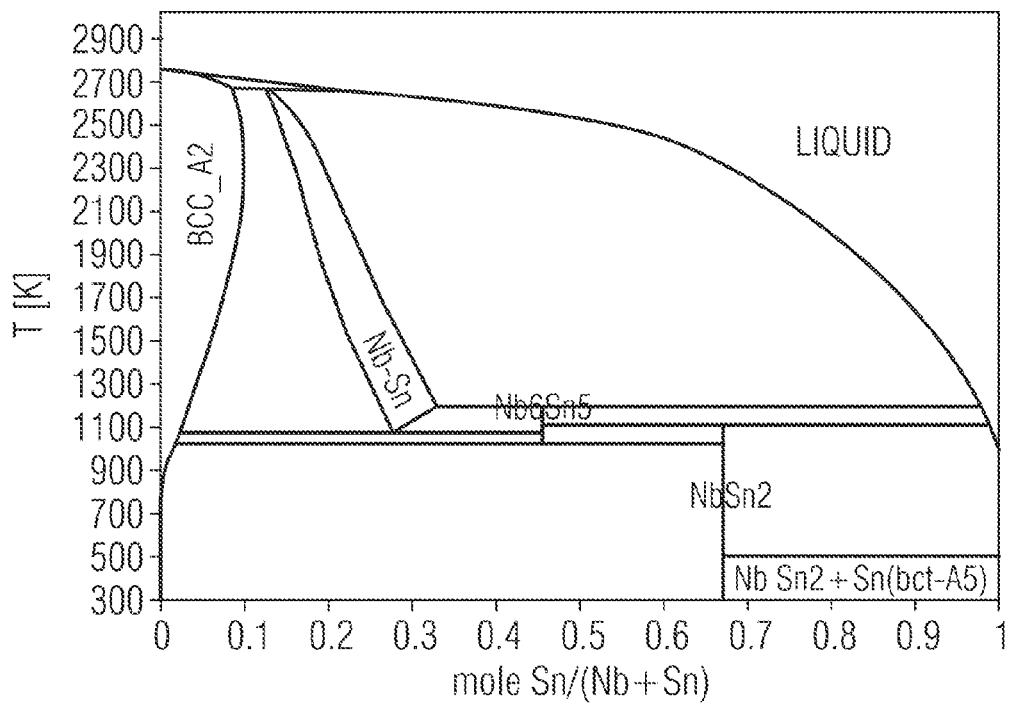
FIG. 12 schematically illustrates an alloy phase diagram of Nb—Sn.

FIG. 12 schematically illustrates an alloy phase diagram of Nb—Sn, wherein the temperature T(K) in Kelvin is plotted against the mole ratio Sn/(Nb+Sn). In the diagram, the liquid phase as well as the phases BCC (Body Centered Cubic)_A2, Nb—Sn, $Nb_6Sn_5$, $NbSn_2$ and $NbSn_2$+Sn(bct(body centered tetragonal)_A5) are shown. From FIG. 12 it becomes apparent that layers made of or including tin as a solder material and described in foregoing paragraphs may also be replaced by layers made of niobium or a Nb—Sn-alloy. For example, the layer 13 of FIG. 4 may be replaced by a niobium layer or a Nb—Sn-alloy layer having similar properties according to the phase diagram of FIG. 12.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein.

What is claimed is:

1. A semiconductor device, comprising:
   a semiconductor chip comprising an active surface;
   a metal layer overlying an opposite surface of the semiconductor chip, the opposite surface opposite the active surface; and
   a layer overlying the metal layer, the layer comprises a metal selected from the group consisting of niobium, tantalum and an alloy comprising niobium and tantalum, wherein a percent by volume of one of niobium, tantalum and an alloy comprising niobium and tantalum in the layer is greater than half of an overall volume of the layer.

2. The semiconductor device of claim 1, wherein the metal layer comprises copper.

3. The semiconductor device of claim 1, wherein the layer has a thickness between 0.5 nanometers and 500 nanometers.

4. The semiconductor device of claim 1, wherein the metal layer and the layer each cover more than half of an area of the opposite surface.

5. The semiconductor device of claim 1, further comprising:
   a further layer comprising a solder material overlying the layer, the further layer coupling the semiconductor device to a carrier.

6. The semiconductor device of claim 1, further comprising:
   a metallization between the semiconductor chip and the metal layer.

7. The semiconductor device of claim 6, wherein the metallization comprises a plurality of stacked metal layers connected to each other via through connections.

8. The semiconductor device of claim 1, wherein a percent by weight of one of niobium, tantalum and an alloy comprising niobium and tantalum in the layer is greater than half of an overall weight of the layer.

9. The semiconductor device of claim 1, further comprising:
   a contact pad disposed overlying the active surface; and
   a conductive layer disposed over the contact pad.

10. The semiconductor device of claim 9, wherein the conductive layer comprises a metal selected from the group consisting of niobium, tantalum and an alloy comprising niobium and tantalum, wherein a percent by volume of one of niobium, tantalum and an alloy comprising niobium and tantalum in the conductive layer is greater than half of an overall volume of the conductive layer.

11. The semiconductor device of claim 9, wherein the conductive layer comprises a metal selected from the group consisting of niobium, tantalum and an alloy comprising niobium and tantalum, wherein a percent by weight of one of niobium, tantalum and an alloy comprising niobium and tantalum in the conductive layer is greater than half of an overall weight of the conductive layer.

12. The semiconductor device of claim 9, wherein the conductive layer comprises niobium, wherein a percent by volume of niobium in the conductive layer is greater than half of an overall volume of the conductive layer.

13. The semiconductor device of claim 9, wherein the conductive layer comprises niobium, wherein a percent by weight of niobium in the conductive layer is greater than half of an overall weight of the conductive layer.

14. The semiconductor device of claim 9, wherein the conductive layer has a thickness between 0.5 nanometers and 500 nanometers.

15. The semiconductor device of claim 9, wherein the conductive layer is in direct contact with the contact pad.

16. The semiconductor device of claim 9, further comprising:
   a connecting element electrically coupled to the contact pad, the connecting element comprising a bonding wire or a clip.

17. The semiconductor device of claim 16, wherein the conductive layer electrically couples the connecting element and the contact pad.

18. The semiconductor device of claim 16, further comprising:
   a solder layer comprising a solder material between the conductive layer and the connecting element.

19. The semiconductor device of claim 18, wherein the solder layer comprises niobium.

20. The semiconductor device of claim 18, wherein the solder layer comprises Nb—Sn.

21. A semiconductor device, comprising:
   a semiconductor chip comprising an active surface;
   a metal layer overlying an opposite surface of the semiconductor chip, the opposite surface opposite the active surface; and
   a first conductive layer comprising niobium overlying the metal layer, wherein a percent by volume of niobium in the first conductive layer is greater than half of an overall volume of the first conductive layer.

22. The semiconductor device of claim 21, wherein a percent by weight of niobium in the first conductive layer is greater than half of an overall weight of the first conductive layer.

23. The semiconductor device of claim 21, further comprising:
   a contact pad disposed overlying the active surface; and
   a second conductive layer disposed over the contact pad.

24. The semiconductor device of claim 23, wherein the second conductive layer comprises a metal selected from the group consisting of niobium, tantalum and an alloy comprising niobium and tantalum, wherein a percent by volume of one of niobium, tantalum and an alloy comprising niobium and tantalum in the layer is greater than half of an overall volume of the second conductive layer.

25. The semiconductor device of claim 23, wherein the second conductive layer comprises a metal selected from the group consisting of niobium, tantalum and an alloy comprising niobium and tantalum, wherein a percent by weight of one of niobium, tantalum and an alloy comprising niobium and tantalum in the second conductive layer is greater than half of an overall weight of the second conductive layer.

26. The semiconductor device of claim 23, wherein the second conductive layer comprises niobium, wherein a percent by volume of niobium in the second conductive layer is greater than half of an overall volume of the second conductive layer.

27. The semiconductor device of claim 23, wherein the second conductive layer comprises niobium, wherein a percent by weight of niobium in the second conductive layer is greater than half of an overall weight of the second conductive layer.

28. The semiconductor device of claim 23, wherein the second conductive layer has a thickness between 0.5 nanometers and 500 nanometers.

29. The semiconductor device of claim 23, wherein the second conductive layer is in direct contact with the contact pad.

30. The semiconductor device of claim 23, further comprising:
   a connecting element electrically coupled to the contact pad, the connecting element comprising a bonding wire or a clip.

31. The semiconductor device of claim 30, wherein the conductive layer electrically couples the connecting element and the contact pad.

32. The semiconductor device of claim 30, further comprising:
   a solder layer comprising a solder material between the second conductive layer and the connecting element.

33. The semiconductor device of claim 32, wherein the solder layer comprises niobium.

34. The semiconductor device of claim 32, wherein the solder layer comprises Nb—Sn.

* * * * *